United States Patent
Kwak et al.

(10) Patent No.: US 8,433,743 B2
(45) Date of Patent: Apr. 30, 2013

(54) ROOT MEAN SQUARE (RMS) METERING DEVICES AND METHODS FOR GENERATING RMS CURRENT LEVEL TO BOTH HIGH OR LOW FREQUENCY WITHIN SIGNAL

(75) Inventors: Sung Ung Kwak, Frisco, TX (US); Levi Victor, Farmers Branch, TX (US); Kenneth Tang, Frisco, TX (US)

(73) Assignee: Maxim Intergrated Products, Inc., San Jose, CA (US)

( * ) Notice: Subject to any disclaimer, the term of this patent is extended or adjusted under 35 U.S.C. 154(b) by 763 days.

(21) Appl. No.: 12/605,663

(22) Filed: Oct. 26, 2009

(65) Prior Publication Data
US 2010/0106763 A1    Apr. 29, 2010

Related U.S. Application Data
(60) Provisional application No. 61/109,424, filed on Oct. 29, 2008.

(51) Int. Cl.
*G06F 7/38*    (2006.01)
(52) U.S. Cl.
USPC ............................ 708/606; 708/607; 341/126
(58) Field of Classification Search .................. 708/606, 708/607; 341/126
See application file for complete search history.

(56) References Cited

U.S. PATENT DOCUMENTS
| | | | |
|---|---|---|---|
| 4,713,608 A | 12/1987 | Catiller | |
| 5,283,517 A | 2/1994 | Havel | |
| 6,765,516 B1 * | 7/2004 | Coley et al. | 341/126 |
| 7,071,759 B2 * | 7/2006 | Tuladhar | 327/348 |
| 2002/0180419 A1 | 12/2002 | Britz | |

FOREIGN PATENT DOCUMENTS
| | | |
|---|---|---|
| EP | 0 414 039 A2 | 2/1991 |
| EP | 0 423 987 A2 | 4/1991 |
| EP | 0 517 549 A2 | 12/1992 |

OTHER PUBLICATIONS
Search Report and Written Opinion for PCT/US2009/062125, Feb. 19, 2010, European Patent Office as ISA, 17 pages.
J. Colominas et al., "A New Method for Measuring RMS Values", Proceedings of the IEEE USA, vol. 74, No. 10, Oct. 1986, pp. 1468-1469, XP002566451. .ISSN: 0018-9219.

* cited by examiner

*Primary Examiner* — Tammara Peyton
(74) *Attorney, Agent, or Firm* — North Weber & Baugh LLP

(57) ABSTRACT

Embodiments of the present invention provide systems, devices and methods for efficiently calculating a true RMS values (either voltage or current) of an AC signal. The RMS value is generated from both high and low frequency components of the AC signal without a high speed ADC being integrated within the system. The high frequency component is processed by calculating an average current waveform of the high frequency component and approximating a corresponding RMS value using a waveform factor. The waveform factor is effectively a scalar that relates the average current waveform of the high frequency component to an appropriate RMS value.

20 Claims, 7 Drawing Sheets

| Wave Type | Waveform | Mean Magnitude (rectified) | Waveform Factor | RMS Value | Crest Factor |
|---|---|---|---|---|---|
| DC | | 1 | | 1 | 1 |
| Sine wave | | $\frac{2}{\pi} \approx 0.637$ | $\frac{\pi}{2\sqrt{2}} \approx 1.11$ | $\frac{\pi}{\sqrt{2}} \approx 0.707$ | $\sqrt{2} \approx 1.414$ |
| Full-wave rectified sine | | $\frac{2}{\pi} \approx 0.637$ | $\frac{\pi}{2\sqrt{2}} \approx 1.11$ | $\frac{\pi}{\sqrt{2}} \approx 0.707$ | $\sqrt{2} \approx 1.414$ |
| Half-wave rectified sine | | $\frac{1}{\pi} \approx 0.318$ | $\frac{\pi}{2} \approx 1.571$ | $\frac{1}{2} = 0.5$ | 2 |
| Triangle Wave | | $\frac{1}{2} = 0.5$ | $\frac{2}{\sqrt{3}} \approx 1.155$ | $\frac{1}{\sqrt{3}} \approx 0.577$ | $\sqrt{3} \approx 1.732$ |
| Square Wave | | 1 | 1 | 1 | 1 |

| Wave Type | Waveform | Mean Magnitude (rectified) | Waveform Factor | RMS Value | Crest Factor |
|---|---|---|---|---|---|
| DC | | 1 | | 1 | 1 |
| Sine wave | | $\frac{2}{\pi} \approx 0.637$ | $\frac{\pi}{2\sqrt{2}} \approx 1.11$ | $\frac{\pi}{\sqrt{2}} \approx 0.707$ | $\sqrt{2} \approx 1.414$ |
| Full-wave rectified sine | | $\frac{2}{\pi} \approx 0.637$ | $\frac{\pi}{2\sqrt{2}} \approx 1.11$ | $\frac{\pi}{\sqrt{2}} \approx 0.707$ | $\sqrt{2} \approx 1.414$ |
| Half-wave rectified sine | | $\frac{1}{\pi} \approx 0.318$ | $\frac{\pi}{2} \approx 1.571$ | $\frac{1}{2} = 0.5$ | 2 |
| Triangle Wave | | $\frac{1}{2} = 0.5$ | $\frac{2}{\sqrt{3}} \approx 1.155$ | $\frac{1}{\sqrt{3}} \approx 0.577$ | $\sqrt{3} \approx 1.732$ |
| Square Wave | | 1 | 1 | 1 | 1 |

Figure 5

ROOT MEAN SQUARE (RMS) METERING DEVICES AND METHODS FOR GENERATING RMS CURRENT LEVEL TO BOTH HIGH OR LOW FREQUENCY WITHIN SIGNAL

CROSS REFERENCE TO RELATED PATENT APPLICATIONS

This application claims priority to U.S. Provisional Application Ser. No. 61/109,424, entitled "RMS Metering Devices and Methods," filed Oct. 29, 2008, which application is incorporated herein by reference in its entirety.

BACKGROUND

A. Technical Field

The present invention relates generally to metering technologies, and more particularly, to efficient and accurate methods of calculating root-mean-square values of an alternating current within a metering device.

B. Background of the Invention

The importance of efficiently and accurately measuring current, voltage and power levels of an alternating current (hereinafter, "AC") signal is well understood by one of skill in the art. Oftentimes, an accurate measurement of certain types of current and voltage levels requires that both low frequency and high frequency components of the AC signal are addressed in measurement or calculation processes. The measurement of high frequency components within the AC signal is oftentimes complex and requires a high speed analog-to-digital converter (hereinafter, "ADC") to properly sample the high frequency component. The inclusion of such a high speed ADC within a metering system can significantly increase the die size of the system, the power consumption as well as its overall cost. As a result, traditional metering systems usually ignore high frequency components of the AC signal when identifying certain signal characteristics such as root-mean-square (hereinafter, "RMS") voltage and current levels and, in so doing, sacrifice a level of accuracy in these calculated levels.

In the case of electricity metering devices, an AC signal to be measured may include high frequency harmonics and high frequency switching currents induced by power factor correction circuits commonly employed to increase power efficiencies. Other high frequency components may also be present on the AC signal, all of which complicate an accurate determination of RMS voltage and current levels of the signal.

Traditional metering devices measure voltage and current on the AC signal, and calculate corresponding power and RMS voltage and current levels. These calculations include averaging, filtering and mathematical operations which are usually simple to implement in the digital domain of the metering device using modern digital signal processing techniques. However, the use of these digital signal processing techniques requires that the AC signal be converted into the digital domain, which is typically done by ADCs. In prior art systems, a high speed ADC within the metering device was required in order to allow conversion of the high frequency component of the signal into the digital domain and measurement of both low and high frequency components of the AC signal. The cost of this high speed ADC is usually too high for a commercially feasible metering device so higher frequency components were ignored and certain RMS calculations contained a corresponding error.

FIG. 1 illustrates an exemplary metering device in which high frequency components are ignored in calculating an RMS current of an AC signal. The metering device 110 provides an RMS voltage calculation, an RMS current calculation and a power calculation. The metering device 110 comprises a voltage input on a first ADC 115, which converts the voltage into the digital domain, and a low frequency current input on a second ADC 120, which converts the low frequency current into the digital domain. High frequency current components in the AC signal may be removed from the current input by using a low pass filter (not shown) in front of this low frequency current input. In certain examples, a single ADC is used to convert both the voltage and current inputs into the digital domain.

In calculating the power, the digitized voltage and low frequency current values are multiplied by multiplier 125. A low pass filter 130 averages the output of the multiplier 125 and generates a power reading.

In calculating the RMS voltage, the digitized voltage is squared by squarer 135 and a low pass filter 140 averages the squared voltage. A square-root module 145 performs a square rooting operation on the averaged squared voltage and generates a corresponding RMS voltage reading.

In calculating the RMS current, the digitized low frequency current is squared by squarer 150 and a low pass filter 155 averages the squared current. A square-root module 160 performs a square rooting operation on the averaged squared current and generates a corresponding RMS current reading.

As previously discussed, the failure to include high frequency components within these operations results in error within one or more of these readings. For example, in certain instances the RMS current reading may be inaccurate by as much as twenty percent from the true RMS current of the AC signal because the high frequency current component is disregarded.

There are certain environments in which accuracy in AC signal metering is important such as data centers in which a large number of computing device operate, and power management and heat monitoring is critical in proper functioning. Failure to properly measure or calculate power, RMS voltage and RMS current levels may lead to mismanagement of the devices and possible damage. Accordingly, what is needed is a device and method that is able to efficiently account for high frequency components of an AC signal in metering measurements and calculations.

SUMMARY OF THE INVENTION

Embodiments of the present invention provide systems, devices and methods for efficiently calculating a true RMS values (either voltage or current) of an AC signal. The RMS value is generated from both high and low frequency components of the AC signal without a high speed ADC being integrated within the system. The high frequency component is processed by calculating an average current waveform of the high frequency component and approximating a corresponding RMS value using a waveform factor. The waveform factor is effectively a scalar that relates the average current waveform of the high frequency component to an appropriate RMS value. This waveform factor varies depending on the shape of the high frequency component and may be determined using various methods described herein. As a result, an accurate RMS value is identified using relatively small and cost efficient circuit architectures.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 5 shows exemplary waveform factors of various wave types according to various embodiments of the invention.

DETAILED DESCRIPTION OF THE PREFERRED EMBODIMENTS

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different electrical components, circuits, devices and systems. The embodiments of the present invention may function in various different types of environments wherein impedance matching is relevant including high frequency RF applications. Structures and devices shown below in block diagram are illustrative of exemplary embodiments of the invention and are meant to avoid obscuring the invention. Furthermore, connections between components within the figures are not intended to be limited to direct connections. Rather, connections between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

In the following description, embodiments of the invention will be described in relation to a metering device that generates a power level, RMS current level and RMS voltage level of an AC signal. However, one skilled in the art will recognize that the present invention may be applied to various different devices and technologies in which accurate and efficient RMS calculations are performed in which high frequency component signals are processed. Additionally, one skilled in the art will recognize that various signals may be analyzed using different embodiments of the invention including different signal types, waveforms, frequencies, etc.

According to various embodiments of the invention, a metering device is provided in which three signal paths are integrated within the device circuitry. A first path calculates a power level associated with an AC signal. A second path calculates an RMS voltage associated with the AC signal. A third path calculates an RMS current associated with the AC signal.

Figure 1:
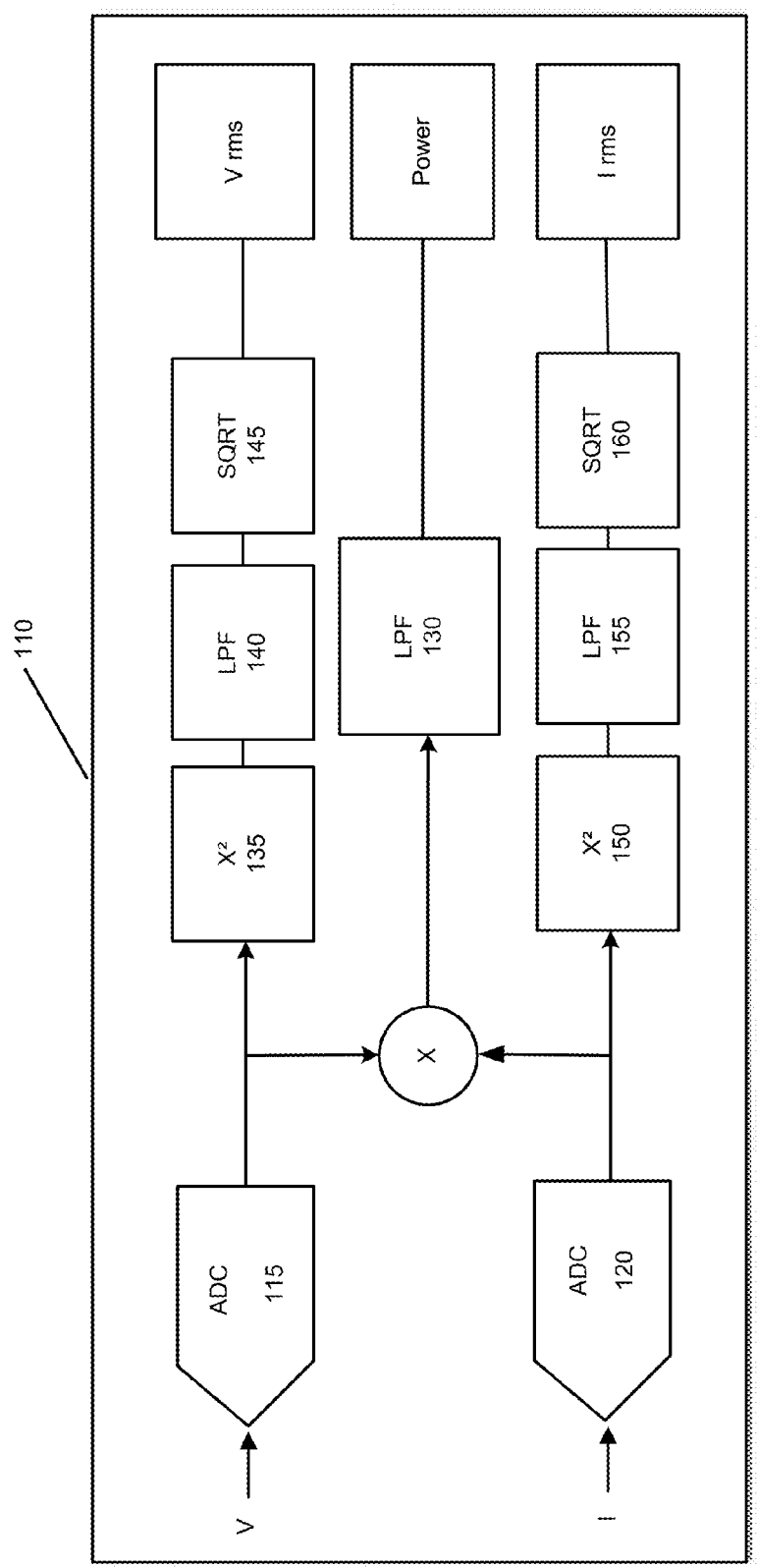
FIG. 1 is a prior art metering device that provides power, RMS voltage and RMS current operations.
Figure 2:
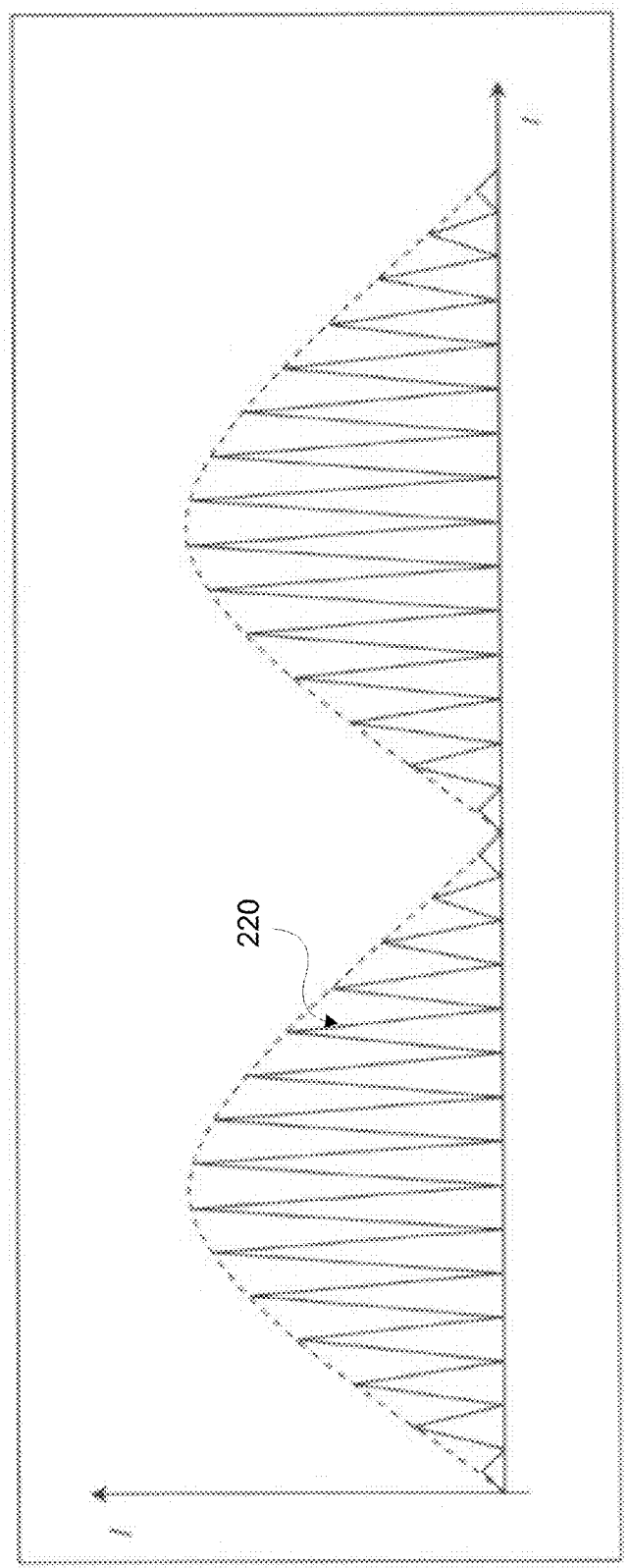
FIG. 2 is a representative high frequency current switching waveform generated by power factor correction circuitry.

As previously described, the AC signal comprises both low frequency and high frequency components. FIG. 2 illustrates an exemplary current waveform having a high frequency component fitted in an envelope of a rectified sine-wave and generated from power factor correction circuitry. In this illustration, a waveform comprises a triangular, high frequency component 220 produced from turning current on and off through a coil inductor within the power factor correction circuitry. In certain examples, the high frequency current can be from 100 KHz to 400 KHz, depending on the load attached to the power supply. One skilled in the art will recognize that the high frequency component may have various waveforms and be generated from different sources within a signal path.

An incoming AC signal is separated into high frequency and low frequency so that each may be processed independently. As previously described, prior art systems are unable to effectively process the high frequency component because of the cost of integrating a high speed ADC within system. A high speed ADC is defined as an ADC having a sampling rate larger than 1 Msps.

Figure 3:
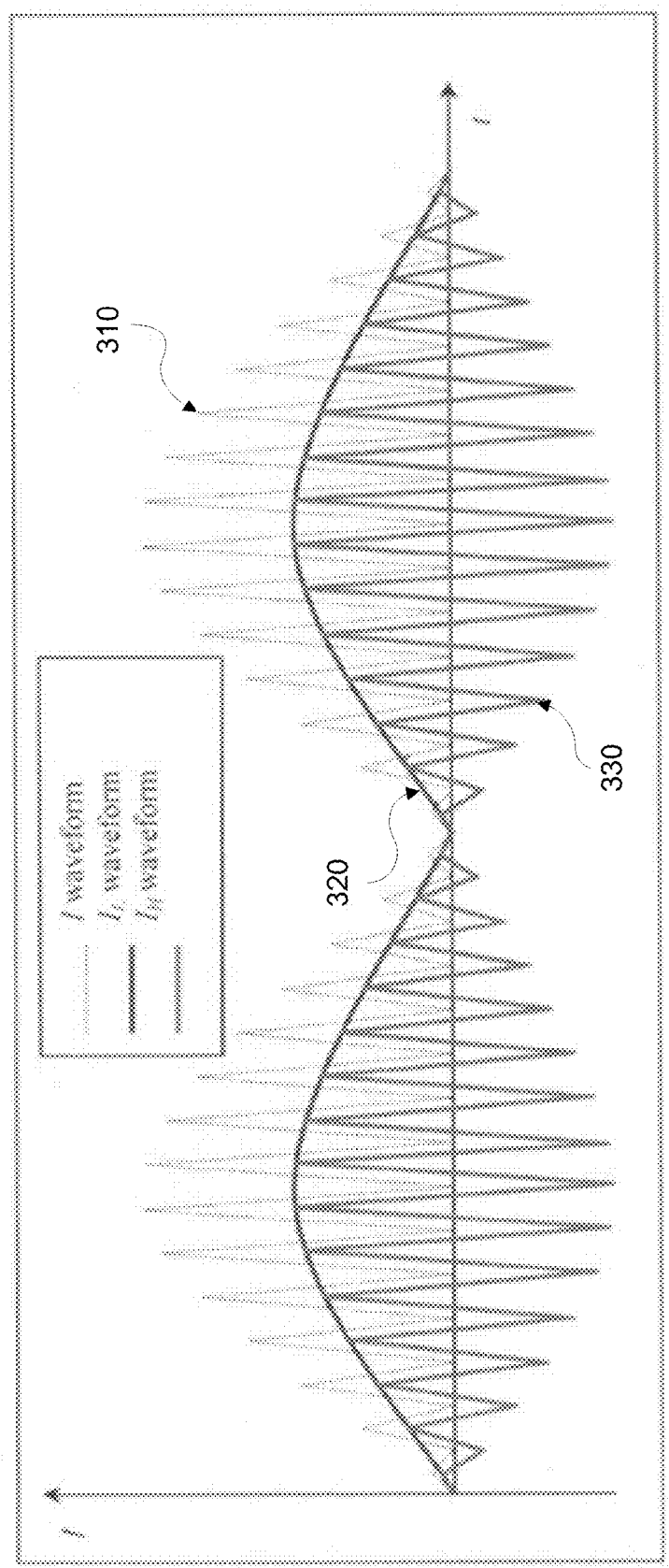
FIG. 3 illustrates a waveform showing both high frequency and low frequency components according to various embodiments of the invention.

In various embodiments of the invention, the high frequency component and low frequency component of the AC signal are separated using filters. In many instances, the two frequency components are substantially different (e.g., low frequency component around 60 Hz and the high frequency component around 400 KHz) so this filtering process is relatively simple. FIG. 3 illustrates an exemplary current waveform generated by both high frequency and low frequency components. The current waveform 310 is comprised of both a low frequency current component 320 and a high frequency current component 330. By separately processing each of the components, power levels, RMS current levels and RMS voltage levels may be calculated for the incoming AC signal in which both components are included within the calculations.

Using both components, an AC signal power level, RMS current level and RMS voltage level may be calculated using the formulas (where T represents the period of the low frequency AC input waveform):

$$\text{Power} = \langle VI \rangle = \frac{1}{T}\int_0^T V(I_L + I_H)dt =$$

$$\frac{1}{T}\int_0^T VI_L dt + \frac{1}{T}\int_0^T VI_H dt = \langle VI_L \rangle + \langle VI_H \rangle = \langle VI_L \rangle$$

$$V_{rms} = \sqrt{\langle V^2 \rangle} = \sqrt{\frac{1}{T}\int_0^T V^2 dt}$$

$$I_{rms} = \sqrt{\langle I^2 \rangle} = \sqrt{\frac{1}{T}\int_0^T (I_L + I_H)^2 dt} = \sqrt{\frac{1}{T}\int_0^T (I_L^2 + 2I_L I_H + I_H^2)dt} =$$

$$\sqrt{\frac{1}{T}\int_0^T I_L^2 dt + \frac{2}{T}\int_0^T I_L I_H dt + \frac{1}{T}\int_0^T I_H^2 dt} =$$

$$\sqrt{\langle I_L^2 \rangle + 2\langle I_L I_H \rangle + \langle I_H^2 \rangle} = \sqrt{\langle I_L^2 \rangle + \langle I_H^2 \rangle}$$

In the above equations, both $\langle VI_H \rangle$ and $\langle I_L I_H \rangle$ become zero because the low frequency component signal is nearly a constant factor in a much shorter averaging time period $T_a$, while the average of the high frequency component signal is zero by definition (i.e., $\langle I_H \rangle = 0$). This may be mathematically described as follow:

$$\langle VI_H \rangle = \frac{1}{T_a} \int_0^{T_a} VI_H \, dt \approx \frac{V}{T_a} \int_0^{T_a} I_H \, dt = V\langle I_H \rangle = 0$$

$$\langle I_L I_H \rangle = \frac{1}{T_a} \int_0^{T_a} I_L I_H \, dt \approx \frac{I_L}{T_a} \int_0^{T_a} I_H \, dt = I_L \langle I_H \rangle = 0$$

Note that Ta represents the typical period of the high frequency current input waveform.

The power equation, $P=\langle VI \rangle$, shows that power can be calculated by taking the average power value between the voltage and low frequency component of current. The RMS of the voltage is unaffected by the presence of the high frequency current component. However, one skilled in the art will recognize that a measurement of the RMS current requires that $\langle I_H^2 \rangle$ be calculated. As previously described, prior art systems would require that the high frequency current component be converted into the digital domain, which is a complicated and costly process. However, according to various embodiments of the invention, instead of directly converting the high frequency current component into the digital domain, a relationship between an average waveform of the high frequency component and the RMS current is leveraged to approximate a digital value of the high frequency current component.

Figure 4:
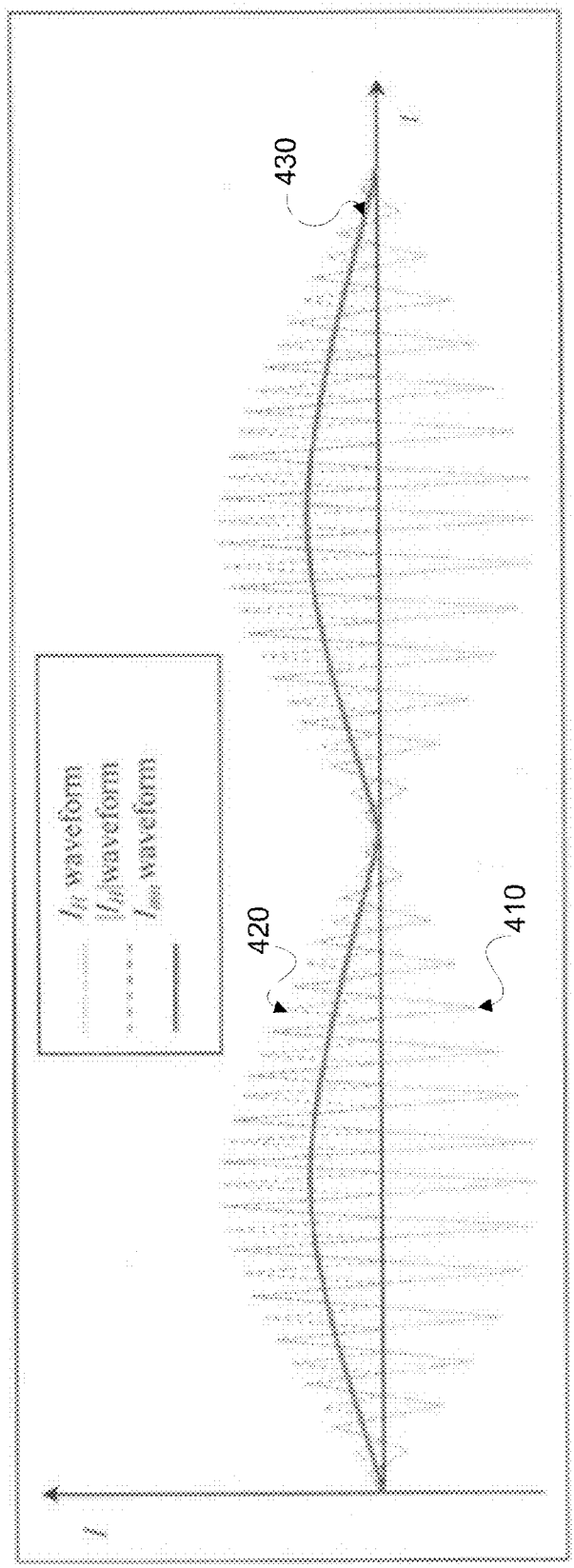
FIG. 4 illustrates a mean current waveform showing both a high frequency component and an absolute high frequency component according to various embodiments of the invention.

In certain embodiments of the invention, an absolute value of the high frequency component is used to identify the average high frequency component. FIG. 4 illustrates an example of an average or mean waveform being generated from the absolute value of the high frequency component. As shown, the average waveform, $I_{mn}$, 430 may be identified from the absolute value, $|I_H|$, 420 of the high frequency current component, which is generated from the high frequency waveform, $I_H$, 410. Obtaining the absolute value of the high frequency current component 410 may be performed by various techniques known within the art including the use of a simple analog hardware circuit employing a comparator and switches. This operation may be mathematically described as follows:

$$I_{mn} = \langle |I_H| \rangle = \frac{1}{T_a} \int_0^{T_a} |I_H| \, dt$$

The average waveform 430 may now be digitized by a slow ADC because of the reduction in frequency relative to the high frequency current component. Using the digitized average waveform and leveraging its relationship with a corresponding current value, an RMS current value for the high frequency current component may be approximated using a waveform factor. The ability to use a slow ADC instead of the fast ADC, previously discussed, allows for a much more cost effective solution in calculating RMS current values.

FIG. 5 illustrates examples of the waveform factors which define relationships between an average or mean magnitude and an RMS value based on a scalar shown as a waveform factor. One skilled in the art will recognize that there may be other waveform factors that relate a mean magnitude to an RMS value.

Using the waveform factor, the RMS current of an AC signal may be approximated by the following equation:

$$Irms = \sqrt{\langle I_L^2 \rangle + \langle I_H^2 \rangle} = \sqrt{\langle I_L^2 \rangle + WF^2 I_{mn}^2} = \sqrt{\langle I_L^2 \rangle + WF^2 \langle |I_H| \rangle^2}$$

Figure 6:
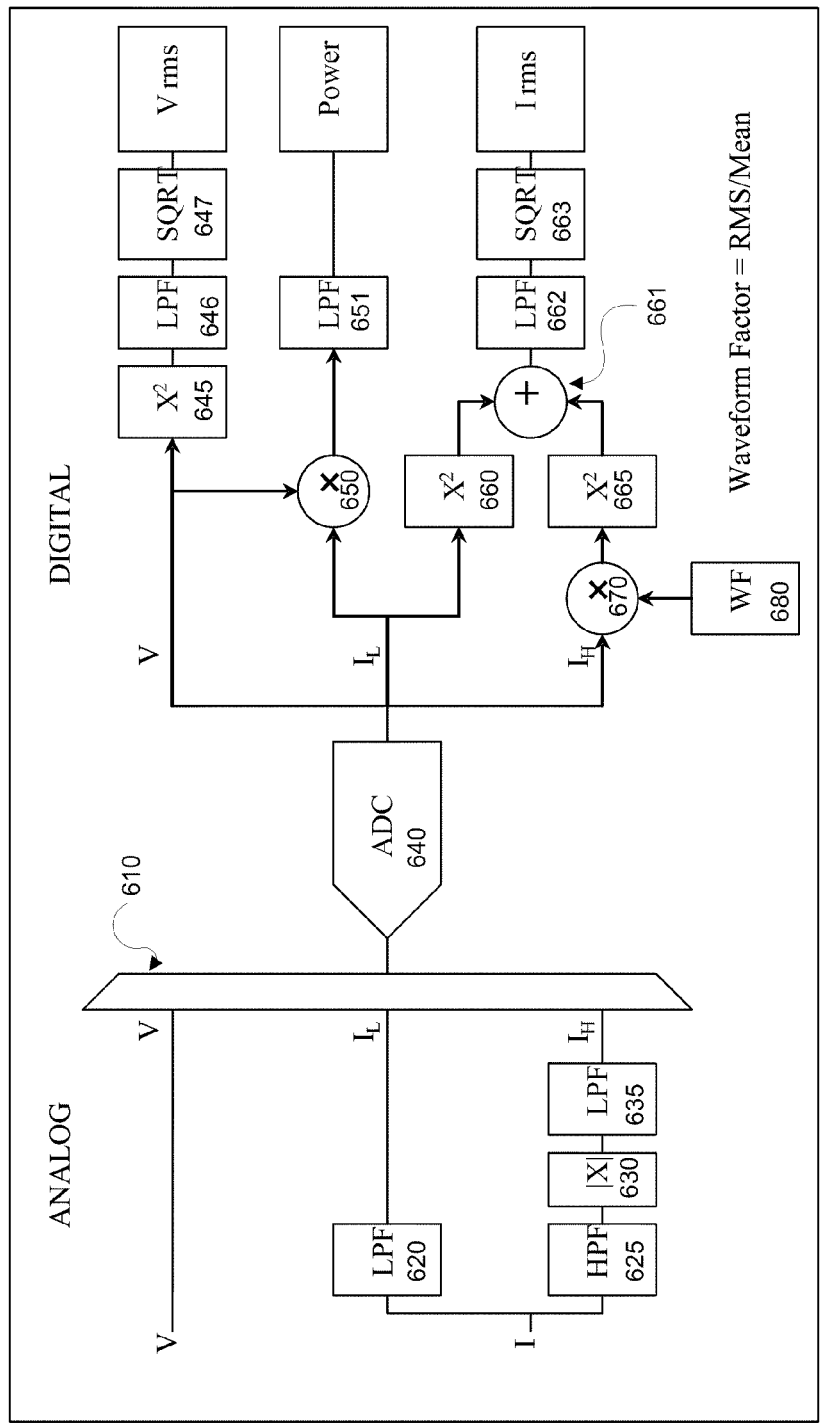
FIG. 6 is a block diagram of a metering device having power, RMS voltage, and RMS current operations according to various embodiments of the invention.

FIG. 6 illustrates a metering device according to various embodiments of the invention. The device has three signal paths comprising an RMS voltage path, a power path, and an RMS current path.

The RMS voltage path receives a voltage input of an AC signal that is switched through a low pass ADC 640 via multiplexer 610. The ADC 640 digitizes the voltage input, which is squared by squarer 645. The output of the squarer 645 is averaged over a particular time period by a low pass filter 646. The averaged voltage signal is then square-rooted by square-root module 647, which generates an RMS voltage corresponding to the voltage input of the AC signal.

Referring to the power path, a current input is received at a low pass filter 620 that outputs a low frequency component of the AC signal to the multiplexer 610. The voltage input of the AC signal is also received at the multiplexer 610, which switches the voltage input and the low frequency component into the ADC 640 so that both may be digitized. The digitized voltage and the digitized low frequency component are multiplied at a multiplier 650 and the resulting signal is averaged by a low pass filter 651. The low pass filter 651 outputs a power calculation corresponding to the AC signal.

The RMS current path receives a current input from the AC signal and splits the input current into high frequency and low frequency components. In certain embodiments, the low pass filter 620 removes the high frequency component and outputs a low frequency component of the AC signal to the multiplexer 610. A high pass filter 625 removes the low frequency component and outputs a high frequency component to an absolute value module 630. The output from the absolute value module 630 is provided to a low pass filter 635 which generates an averaged, absolute value waveform corresponding to the high frequency component of the AC signal. This averaged waveform is provided to the multiplexer 610, which switches the low frequency component and the averaged waveform corresponding to the high frequency component into the ADC 640, which digitizes both signals.

The digitized low frequency component is squared by squarer 660 and the output provided to summer 661. The digitized averaged waveform, generated from the absolute value of the high frequency component, is provided to a multiplier 670, which multiplies the averaged waveform with a waveform factor 680. As previously discussed, the waveform factor 680 functions as a scalar that relates the average waveform with an RMS value. One skilled in the art will recognize that an appropriate waveform factor 680 may be identified using different methods, examples of which are discussed later.

The multiplier 670 outputs an RMS value, related to the high frequency component, to a squarer 665 that squares the RMS value and provides this output to the summer 661. The summer 661 adds the squared RMS value related to the high frequency component and the squared, digitized low frequency component and provides this output to the low pass filter 662. The low pass filter 662 averages this signal and provides the signal to a square-root module 663, which generates an RMS current level for the AC signal. This RMS current level accounts for both high frequency and low frequency components within the AC signal.

Figure 7:
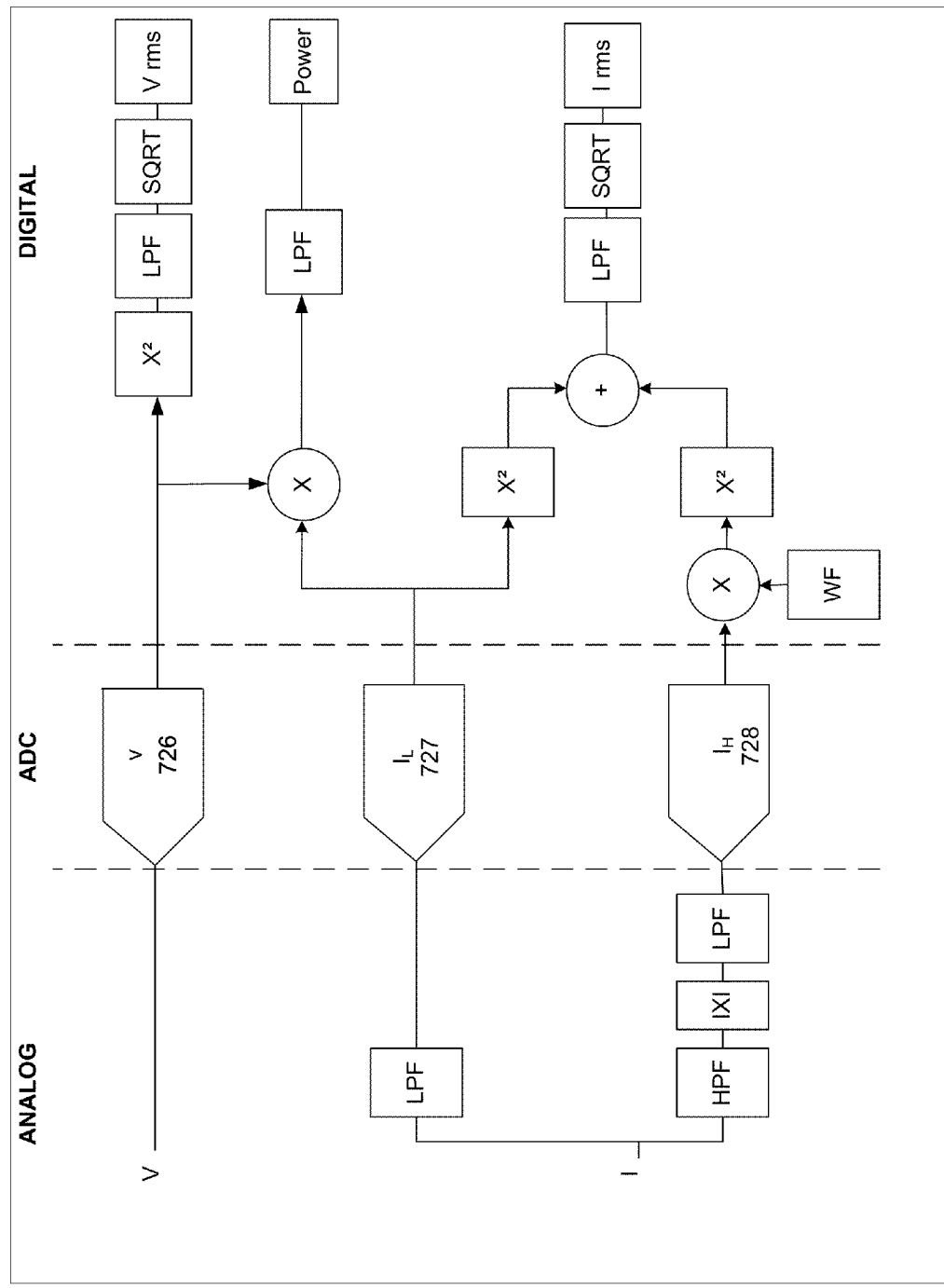
FIG. 7 is another block diagram of a metering device having power, RMS voltage and RMS current operations according to various embodiments of the invention.

One skilled in the art will recognize that other circuits may be employed to achieve the same results. For example, FIG. 7 illustrates a circuit in which discrete low speed ADCs 726, 727, 728 and used in place of the multiplexer 610 and the low speed ADC 640.

In various embodiments of the invention, the waveform factor 680 may be identified using various methods. In a first example, the waveform factor 680 is identified and programmed into the circuit a priori based on a pre-existing knowledge of the waveform of high frequency components of a signal to be measured. This pre-existing knowledge may be based on an understanding of the source of the high frequency component and associated waveform generated from this source. In a second example, the waveform factor 680 is identified during calibration by observing the high frequency component, such as looking at it on an oscilloscope, and manually matching the waveform with an appropriate waveform factor. In a third example, the circuit is calibrated by providing test signals, with known RMS current values, into the circuit and identifying an appropriate waveform factor 680. This calibration process may be performed multiple times so that a preferred waveform factor is iteratively identified so that performance of the circuit is specifically tailored to the environment in which it operates.

The foregoing description of the invention has been described for purposes of clarity and understanding. It is not intended to limit the invention to the precise form disclosed. Various modifications may be possible within the scope and equivalence of the appended claims.

What is claimed is:

1. A Root Mean Square ("RMS") meter comprising:
a current interface on which a current signal is received;
at least one analog-to-digital converter that outputs a digitized low frequency current signal corresponding to a low frequency component of the current signal and a digitized averaged absolute value wave form corresponding to a high frequency component of the current signal;
a first current squarer, coupled to receive the digitized low frequency current signal, the first current squarer generating a digitized low frequency squared current signal;
a first multiplier, coupled to receive the digitized averaged absolute value waveform and a waveform factor, the first multiplier generating an approximated RMS value corresponding to an RMS value of the high frequency component of the current signal;
a second current squarer, coupled to receive the approximated RMS value, the second current squarer generating a squared RMS value;
a summer, coupled to receive the digitized low frequency signal and the squared RMS value, the summer generating a summed squared current output corresponding to both high and low frequency components of the current signal;
a first low pass filter, coupled to receive the summed squared current output, the low pass filter generating an averaged summed squared current output; and
a square-root module, coupled to receive the averaged summed squared current output, the square-root module generating an RMS current level corresponding to both the high frequency and low frequency components within the current signal.

2. The RMS meter of claim 1 further comprising:
a first voltage interface on which a digitized voltage signal is received; and
an RMS voltage path, coupled to receive the digitized voltage signal, the RMS voltage path comprising a voltage squarer, a lowpass filter, and a voltage square root module which generates an RMS voltage value for the digitized voltage signal.

3. The RMS meter of claim 2 further comprising:
a second multiplier, coupled to receive the digitized voltage signal and the digitized low frequency current signal, the second multiplier generating a power signal;
a second low pass filter, coupled to receive the power signal, the second low pass filter generating a power calculation.

4. The RMS meter of claim 3 further comprising a multiplexer, coupled to receive a voltage signal, the low frequency component of the current signal and the high frequency component of the current signal, the multiplexer switching each of the voltage signal, the low frequency component of the current signal and the high frequency component of the current signal onto a corresponding path.

5. The RMS meter of claim 3 wherein the at least one analog-to-digital converter is a single analog-to-digital converter coupled to the multiplexer and through which a voltage path, a low frequency current path and a high frequency current path are provided.

6. The RMS meter of claim 3 further comprising:
a high pass filter, coupled to the current interface, the high pass filter removing at least a portion of the low frequency component from the current signal;
an absolute value module, coupled to the high pass filter, that applies an absolute value operation on an output of the high pass filter; and
a low pass filter, coupled between the absolute value module and a multiplexer, the low pass filter generating an averaged, absolute value waveform corresponding to the high frequency component of the current signal.

7. The RMS meter of claim 6 further comprising a low pass filter, coupled to the current interface, the low pass filter removing a high frequency component from the current signal.

8. The RMS meter of claim 1 wherein the waveform factor is generated a priori based on an understanding of the high frequency component waveform.

9. The RMS meter of claim 1 wherein the waveform factor is generated during a calibration process by observing the high frequency component of the current signal.

10. An RMS metering system comprising:
a voltage path that receives a digitized voltage signal and generates an RMS voltage corresponding to the digital voltage signal;
a current path that receives a digitized low frequency component of a current signal and a digitized averaged absolute value waveform corresponding to the high frequency component of the current signal, the current path generates an RMS current by processing the digitized low frequency component, the digitized averaged absolute value waveform and a waveform factor; and
a power path that receives the digitized voltage signal and the digitized low frequency component of the current signal, the power path generates a power value corresponding to the digitized voltage signal and the digitized low frequency component of the current signal.

11. The RMS metering system of claim 10 wherein an analog-to-digital converter generates the digitized voltage signal from an analog voltage signal and wherein the analog-to-digital converter generates the digitized low frequency component of the current signal and the digitized averaged absolute value waveform corresponding to the high frequency component of the current signal.

12. The RMS metering system of claim 10 wherein a plurality of analog-to-digital converters generate the digitized voltage signal from an analog voltage signal, the digitized low frequency component of the current signal, and the digitized averaged absolute value waveform corresponding to the high frequency component of the current signal.

13. The RMS metering system of claim 10 wherein the current path comprises:
- a first current squarer, coupled to receive the digitized low frequency component of the current signal, the first current squarer generating a digitized low frequency squared current signal;
- a multiplier, coupled to receive the digitized averaged absolute value waveform and a waveform factor, the first multiplier generating an approximated RMS value corresponding to an RMS value of the high frequency component of the current signal;
- a second current squarer, coupled to receive the approximated RMS value, the second current squarer generating a squared RMS value;
- a summer, coupled to receive the digitized low frequency signal and the squared RMS value, the summer generating a summed squared current output corresponding to both high and low frequency components of the current signal;
- a first low pass filter, coupled to receive the summed squared current output, the low pass filter generating an averaged summed squared current output; and
- a square-root module, coupled to receive the averaged summed squared current output, the square-root module generating an RMS current level corresponding to both the high frequency and low frequency components within the current signal.

14. The RMS metering system of claim 10 wherein the voltage path comprises a voltage squarer, a lowpass filter, and a voltage square root module which generates an RMS voltage value for the digitized voltage signal.

15. The RMS metering system of claim 10 wherein the power path comprises:
- a multiplier, coupled to receive the digitized voltage signal and the digitized low frequency current signal, the second multiplier generating a power signal;
- a second low pass filter, coupled to receive the power signal, the second low pass filter generating a power calculation.

16. A method for calculating an RMS current value, the method comprising:
- receiving an analog current signal;
- squaring a digitized low frequency current signal corresponding to a low frequency component of the analog current signal;
- generating an approximate RMS value of a high frequency component of the analog current signal, the approximate RMS value being generated by multiplying a digitized averaged absolute value waveform with a waveform factor;
- squaring the approximate RMS value;
- summing the approximate RMS value with the digitized low frequency squared current signal;
- averaging the summed approximate RMS value and digitized low frequency squared current signal; and
- generating an RMS current value by square-rooting the averaged summed approximate RMS value and digitized low frequency squared current signal.

17. The method of claim 16 further comprising the steps of:
- isolating a waveform of the analog current signal by removing low frequency components from the analog current signal;
- performing an absolute value operation on the waveform of the analog signal;
- averaging the absolute value waveform; and
- digitizing the averaged absolute value waveform such that a digitized averaged absolute value waveform is created.

18. The method of claim 16 further wherein the digitized low frequency current signal is generated by removing a high frequency component from the analog current signal and digitizing the resulting low frequency current signal.

19. The method of claim 16 wherein the waveform factor is generated a priori based on an understanding of the high frequency component waveform.

20. The method of claim 16 wherein the waveform factor is generated during a calibration process by observing the high frequency component of the analog current signal.

* * * * *